LAMINATE OF ALTERNATE CONDUCTIVE AND DIELECTRIC LAYERS

Filed Nov. 21, 1963 2 Sheets-Sheet 1

INVENTOR.
DAVID J. VALLEY
BY Lawrence G. Kastriner
ATTORNEY

INVENTOR
DAVID J. VALLEY
BY Lawrence G. Kastriner
ATTORNEY

United States Patent Office 3,268,773

Patented August 23, 1966

3,268,773

LAMINATE OF ALTERNATE CONDUCTIVE AND DIELECTRIC LAYERS

David J. Valley, Cleveland, Ohio, assignor to Union Carbide Corporation, a corporation of New York

Filed Nov. 21, 1963, Ser. No. 325,427
10 Claims. (Cl. 317—101)

This invention relates to material useful in the production of thin film resistors and capacitors. More particularly, it relates to a laminate containing conductive and dielectric layers from which thin film resistors and capacitors can be fabricated by cutting, such as by etching, through appropriate layers.

Thin films of various conductive materials and dielectric materials have been used for making capacitor and resistor components. Such components are especially useful when combined to form the passive portion of an electronic circuit. Such component combinations are frequently called "printed circuits" since the thin films are applied in desired shapes by procedures often analogous to printing. The thin films are generally applied by vacuum vapor deposition techniques employing masks to shield undesired areas of a substrate from being coated by the vapor deposited material. Thus procedure requires the use of specially designed masks for each variation in component arrangement and for most variations in component values. Furthermore, since the mask has a finite thickness, there is a shadow effect which can in some instances impair the dimensional accuracy of the deposited thin film. Because of the vastly different component values in even the simplest circuit, no single material is satisfactory for all resistors or for all capacitors. Presently, a number of different materials are used to form a passive integrated circuit containing resistors and capacitors. Each material is deposited by a separate coating and masking process. The consequences of such a procedure are: high equipment and tooling costs for the masks and low volume production because of the specific nature of each circuit. The overall cost of producing a specific circuit is thus undesirably high.

Attempts have been made in the prior art to improve upon the production of thin film integrated resistor and capacitor circuitry but such attempts have been commercially unsuccessful since the material combinations employed were still quite limited in their utility.

It is an object of the present invention to provide a material universally useful in producing a wide variety of integrated passive circuits.

It is a further object of the present invention to provide improved passive components useful in thin film integrated circuits.

It is still a further object of the present invention to provide improved thin-film integrated circuits.

In the broadest form of the present invention, a laminate useful for the production of a variety of thin film passive resistor and capacitor electric circuit components is provided which comprises a plurality of alternating conductive and dielectric layers, wherein at least one conductive layer is a low resistance thin film, at least one conductive layer is a high resistance thin film, at least one dielectric layer forms the dielectric of a low unit capacitance film planar capacitor and at least one dielectric layer forms the dielectric of a high unit capacitance film planar capacitor, each of said layers being in intimate contact with the next adjacent layer. This laminate is used to form resistor and capacitor components by cutting through, preferably by etching, appropriate layers and thus electrically isolating portions of the laminate from the remainder of the laminate. The resistance or capacitance of the resulting isolated component is determined by the thicknesses of the films involved as well as the length and width of the component. A laminate having both high and low resistance films as well as high and low unit capacitance dielectrics can be used in almost an infinite variety of combinations to produce thin film resistors and capacitors and then such components can be connected together to form integrated circuits. It is preferred that the high resistance film have a unit resistance about 500 times that of the low resistance film. Likewise, it is preferred that the high capacitance dielectric should have a unit capacitance value about 500 times that of the low capacitance dielectric. Obviously, the variations between the high and low resistance films and dielectrics may be greater or less than 500 fold. Furthermore, all the layers of the novel laminate of the present invention need not be employed in every use thereof. This invention, however, makes available greater flexibility in circuit design and construction than any prior art materials.

Figure 1:
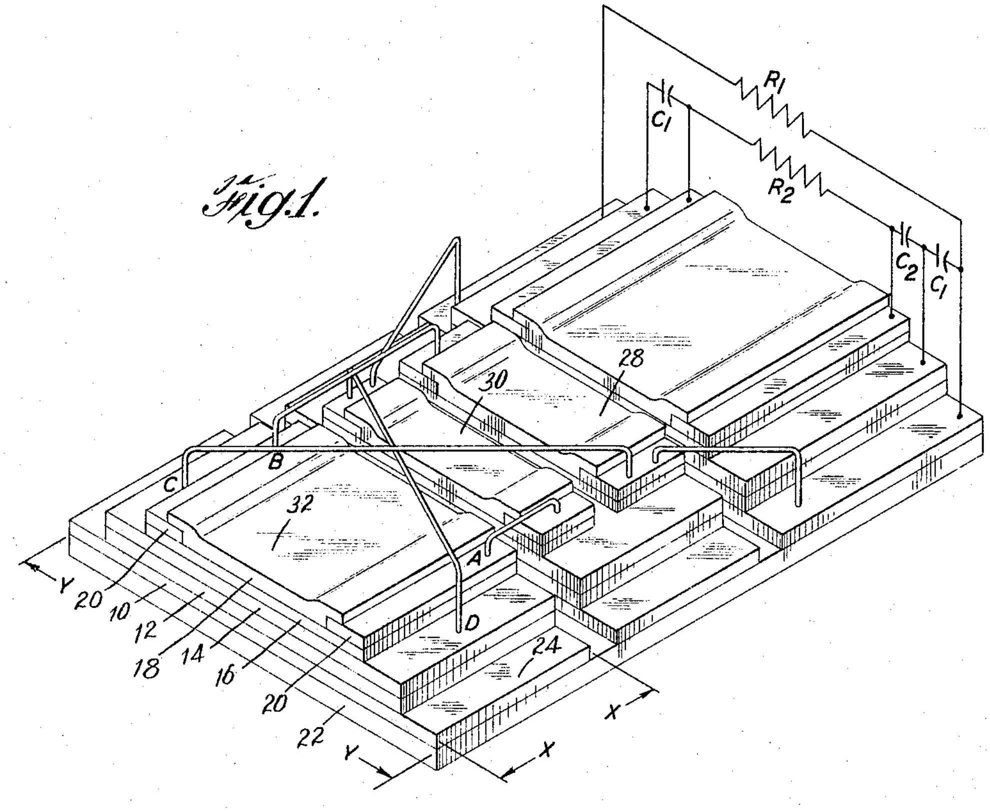
FIG. 1 shows an isometric view of one form of universal laminate of the present invention which has been employed to form thin-film resistors and capacitors which have been connected in one form of an integrated passive circuit.

The laminate of FIG. 1 comprises a plurality of alternating conductive and dielectric layers. The conductive layers have thicknesses of about 100 A. to about 10,000 A. The dielectric layers have thicknesses of about 100 A. to about 50,000 A. Layer 10 is a conductive metal which can form a low resistance film component. "Low resistance" is exemplified by values of resistance in the order of about 100 ohms for a one mil wide and about ½-in. long thin film having a thickness in the above indicated range. The width of the films is measured along the X—X direction shown in FIG. 1 for layer 10. The length of the films is measured along the Y—Y direction. Metals useful in the first conductive metal layer 10 are tantalum, aluminum, tungsten, niobium, hafnium, titanium and zirconium. Since resistance is inversely proportional to the film width, a two mil wide film has a resistance of 50 ohms, other dimensions remaining constant. Layer 12 is a dielectric material which forms the dielectric of a high unit capacitance film planar capacitor. "High unit capacitance" is exemplified by values of capacitance in the order of about 1000 micro-microfarads per mil of width and length of about ½ in. for a thin dielectric film having a thickness in the above indicated range. The capacitance is directly proportional to the width of the films, other dimensions remaining constant. Materials useful in this first dielectric layer are metal oxides, such as tantalum oxide, aluminum oxide, tungsten oxide, niobium oxide, hafnium oxide, titanium oxide and zirconium oxide. The first dielectric layer 12 is bonded to the first conductive metal layer 10 and preferably has a smaller surface area than metal layer 10. This enables a portion 24 of the metal layer 10 to be exposed and thus provide electrical contact area for electrical leads which can be used to connect the film into an integrated circuit. A second conductive metal film 14 is bonded to the first dielectric layer 12. This second conductive metal layer 14 is formed from highly conductive, low resistance metals such as gold, silver, copper, platinum, iridium, palladium and rhodium. Layer 14 is employed as an electrode in a capacitor or as a connecting lead between other films or components formed from the laminate. A second dielectric layer 16 is bonded to the second conductive metal layer 14 and preferably has a smaller surface area than layer 14. This enables a portion 26 of the metal layer 14 to be exposed and thus provides electrical contact area for electrical leads. The second dielectric layer 16 is formed from dielectric material, such as silicon monoxide, which has a low unit capacitance. Also useful are organic dielectrics such as polystyrene, polyethylene, polyethylene terephthalate and the poly-p-xylylenes (Parylene). "Low unit capacitance" is exemplified by values of capacitance in the order of about 2 micro-microfarads per mil of width and length of about ½ in. of thin dielectric film having a thickness in the above indicated range. A third conductive metal layer 20 is preferably applied along the upper periphery of dielectric layer 16 to provide an electrical contact area. Metal layer 20 is formed from the same metals as described above for metal layer 14. Layer 18 is a conductive metal-ceramic and is bonded to the second dielectric layer 16 and to metal layer 20 and preferably has a smaller surface area than the dielectric layer 16. Conductive metal ceramics useful in layer 18 are exemplified by mixtures of silicon monoxide of silicon dioxide with readily oxidizable metals, such as chromium, aluminum, manganese, beryllium and the like. Mixtures of glass frit and conductive metal, such as silver, can also be used. Conductive layer 18 can form a high resistance film component. "High resistance" is exemplified by values of resistance in the order of about 50,000 ohms for a one mil wide and ½ in. long thin film having a thickness in the above indicated range. All the above described layers are preferably deposited on an insulating substrate 22 which supplies mechanical strength and rigidity to the laminate and thus aids in maintaining dimensional stability. Materials such as glasses, ceramics, metals coated with electrical insulators and the like are conveniently used for substrate 22.

The above described layers are formed by several techniques. They can be applied by electrodeposition, painting techniques and the like, but the metal layers and the silicon monoxide and organic-dielectrics are preferably applied by vapor deposition under reduced pressure. Such vapor deposition techniques are well known in the art. The metal oxide dielectric layer 12 is preferably obtained by electrolytic oxidation of the metal layer 10. The conductive metal ceramic materials, such as chromium-silicon monoxide mixtures, are preferably applied by vapor deposition. The conductive metal ceramic materials, such as glass frit-silver, suspended in organic solvents are conveniently painted on a substrate and then sintered in place after evaporation of the solvent. When a painted metal ceramic layer is employed it must be applied first, otherwise the sintering tempertaure would damage any previously applied films.

The poly-p-xylylenes mentioned above as useful dielectric materials in the laminates of the present invention are obtained through condensation of vaporous diradicals having the structure:

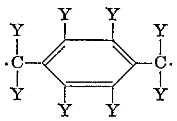

in which Y can represent any inert monovalent group, as hereinafter more fully described. These p-xylylene diradicals are stable in the vaporous state at temperatures above 200–250° C. but will condense into a thin void free film of a solid linear polymer, termed herein "poly-p-xylylene" which can be characterized by the repeating structure:

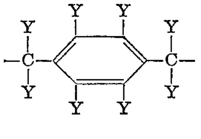

Each different diradical tends to have its separate condensation temperature generally ranging from about 25° C. to about 250° C. or slightly above depending to a degree on the ambient pressure of the system.

These polymers are unique for dielectric films for capacitors not only because of their usage as thin films but also because of other outstanding properties. They have a high dielectric constant and low dissipation factor and can be used over a broad range of temperatures.

The above mentioned p-xylylene diradicals can be made by any of several techniques. The method found most convenient and preferred is by the pyrolysis at temperatures between about 450° C. and about 700° C. of at least one cyclic dimer represented by the structure:

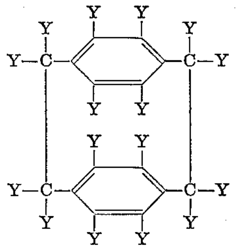

wherein Y is any monovalent inert substituent group, preferably hydrogen or halogen although on the aromatic nucleus, it can be any inert substituent group when starting with this dimer. The Y substituents on the alpha carbon atoms must be non-polar. On pyrolysis, the dimer cleaves into two separate reactive vaporous diradicals each having the structure:

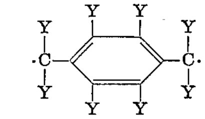

Thus, where all the Y groups are hydrogen, or where the nuclear substituent on each diradical is the same, two moles of the same p-xylylene diradical are formed, and when condensed yield a substituted or unsubstituted p-xylylene homopolymer. When the aromatic nuclear substituent Y groups on each diradical are different or where they are the same but are present on the diradical species in different amounts, two different diradicals are formed, condensation of which will yield copolymers as hereinafter set forth.

Alpha substituted p-xylylene diradicals, as for example the alpha-halogen substituted compounds, are also prepared by the pyrolysis of an aryl bis-sulfone of the structure:

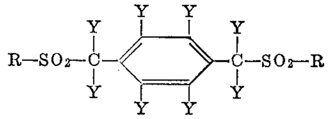

where R is a lower hydrocarbon group, and Y is defined as above. The Y substituents on the alpha carbon atoms must be non-polar as well as inert. These sulfones pyrolyze on heating to temperatures of about 600° C.–1000° C. into sulfur dioxide and the reactive diradical

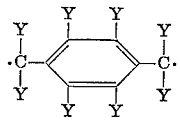

This technique is particularly desirable for introducing alpha halo substituent groups in the polymer. Outstanding among such polymers is the highly thermally stable poly($\alpha,\alpha,\alpha',\alpha'$ tetrafluoro-p-xylylene).

Reactive diradicals are also prepared by the pyrolysis of a diaryl sulfone of the structure:

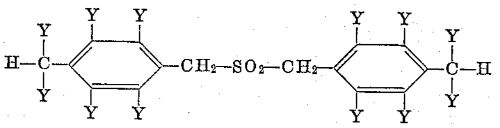

wherein Y is defined as above. The Y substituents on the alpha carbon atoms must be non-polar. These sulfones pyrolyze on heating to temperatures of about 400° C.–800° C. into sulfur dioxide and 2 moles of monoradical of the formula:

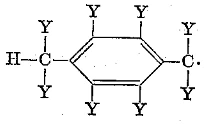

which disproportionates into a p-xylene and a diradical of structure:

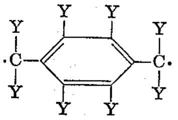

Any other technique of making the vaporous diradicals can of course be used. Since some of these techniques produce other gaseous by-products (such as $SO_2$) and since certain of the metals employed in the production of novel laminates may be subjected to attack by such by-products, care should obviously be used in selecting the metal to be deposited when employing such reactive diradicals by other diverse means. Since the pyrolysis of the cyclic dimer di-p-xylylene involves no other by-products and the dimer cleaves quantitatively into two moles of the reactive diradical, this method is most preferred.

Inasmuch as the coupling and polymerization of these reactive diradicals upon the condensation of the diradicals does not involve the aromatic ring, any unsubstituted or desired substituted p-xylylene polymer can be prepared since the substituent groups function essentially as an inert group. Thus, the substituent Y— group can be any organic or inorganic group which can normally be substituted on an aromatic nucleus or on the aliphatic α carbon atoms of such a diradical.

Notable among the monovalent inert groups that have been placed on the aromatic nuclei or aliphatic α carbon atoms of such poly(p-xylylenes) other than hydrogen are the halogens including chlorine, bromine, iodine and fluorine, alkyl groups such as methyl, ethyl, propyl, butyl and hexyl, cyano, phenyl, amine, nitro, carboxyl, benzyl and other similar groups. While some of the above groups are potentially reactive in certain conditions or with certain reactive materials, they are unreactive under the conditions of the present invention and hence are truly inert in the instant case.

However, since the polymer serves here as a dielectric medium and many of the above substituted poly(p-xylylenes) will have a noticeable or appreciable dipole moment, they do not all provide equal and equivalent results in capacitors employing such materials as dielectrics. The dissipation factor of certain of the poly(p-xylylenes) having highly polar substituent groups on the aromatic rings may be higher than that which can be tolerated for certain specific end uses. However, for other uses, high dissipation factor may not be objectionable or could possibly be a desired function of the specific dielectric layer, since these substituted poly(p-xylylenes) often have a higher dielectric constant than does the unsubstituted polymer.

It may also be evident that certain physical attributes of the specific poly(p-xylylene) may be so desirable that the dielectric properties may be acceptable or tolerated. Poly(2-chloro-p-xylylene) for example, is a very tough polymer having certain mechanical benefits over other poly(p-xylylenes). Also poly(α,α,α',α', tetra-fluoro-p-xylylene) is highly temperature resistant and can even tolerate exposure of 300° C. for 100 hours without any change in physical strength. Of the substituted poly(p-xylylenes) these two are preferred. Normally however, for most general applications, the unsubstituted poly-p-xylylene is preferred for use in the present invention, i.e., where all Y substituents on the polymer are hydrogen, as the polymer made from it possesses the most stable electrical properties and the most desirable dielectric constant and power factor of all these polymers.

The substituted di-p-xylylenes and the aryl sulfones from which these reactive diradicals are prepared, can be prepared by techniques commonly known to most organic chemists. For example, the cyclic dimer, di-p-xylylene, is readily susceptible to halogenation, alkylation and/or oxidation and reduction techniques and like methods of introduction of such substitutent groups into aromatic nuclei. Inasmuch as the cyclic dimer is a very stable product up to temperatures of about 400° C., elevated temperature reactions can also be employed for the preparation of various substituted materials. As used herein the term "di-p-xylylene" refers to any substituted or unsubstituted cyclic di-p-xylylene as hereinabove discussed, and the term "p-xylylene diradical" refers to any substituted or unsubstituted p-xylylene structure having a free radical or free valence electron on each alpha carbon atom as hereinabove discussed.

In the polymerization process, the vaporous diradicals condense and polymerize nearly instantaneously at the condensation temperature of the diradicals. The coupling of these diradicals involves such low activation energy and the chain propagation shows little or no preference as to the particular diradical, so that steric and electronic effects are not important as they are in vinyl polymerization, for example. The substituted and/or unsubstituted p-xylylene homopolymers can be made by cooling the vaporous diradical down to any temperature below the condensation temperature of the diradical. It has been observed that for each diradical species, there is a definite ceiling condensation temperature above which the diradical essentially will not condense and polymerize. All observed ceilings of substituted p-xylylene diradicals have been below about 200° C. but vary to some degree upon the operating pressure involved. For example, at 0.5 mm. Hg pressure, the optimum condensation and polymerization temperatures observed for the following diradicals are:

| | |
|---|---|
| p-Xylylene | 25–30° C. |
| Chloro-p-xylylene | 70–80° C. |
| n-Butyl-p-xylylene | 130–140° C. |
| Iodo-p-xylylene | 180–200° C. |
| Dichloro-p-xylylene | 200–250° C. |
| Tetra α,α,α',α',fluoro-p-xylylene | 35–40° C. |

Thus, by this process, homopolymer dielectric films are made by maintaining the substrate surface at a temperature below the ceiling condensation temperature of the particular diradical species involved, or desired in the homopolymer. This is most appropriately termed "homopolymerizing conditions."

Where several different diradicals existing in the pyrolyzed mixture have different vapor pressure and condensation characteristics, as for example, p-xylylene and chloro-p-xylylene and dichloro-p-xylylene or any other mixture with other substituted diradicals, homopolymerization will result when the condensation and polymerization temperature is selected to be at or below that temperature where only one of the diradicals condense and polymerize. Thus, for purposes within this application, the terms "under homopolymerization conditions" are intended to include those conditions where only homopolymers are formed. Therefore, it is possible to deposit homopolymers from a mixture containing one or more of the substituted diradicals when any other diradicals present have different condensation or vapor pressure characteristics, and wherein only one diradical species is condensed and polymerized on the substrate surface. Of course, other diradical species not condensed on the substrate surface can be drawn through the deposition apparatus in vaporous form to be condensed and polymerized in a subsequent cold trap.

Inasmuch as unsubstituted p-xylylene diradicals, for example are condensed at temperatures about 25° C. to 30° C., which is much lower than chloro p-xylene diradicals, i.e., about 70° to 80° C., it is possible to have present such diradicals in the vaporous pyrolyzed mixture along with the chlorine-substituted diradicals. In such a case, homopolymerizing conditions are secured by maintaining the substrate surface at a temperature below the ceiling condensation temperature of the substituted p-xylylene but above that of the p-xylylene, thus permitting the p-xylylene vapors to pass through the apparatus without condensing and polymerizing but collecting the poly-p-xylylene in a subsequent cold trap.

It is also possible to obtain substituted copolymers through the pyrolysis process hereinabove described. Copolymers of p-xylylene and substituted p-xylylene diradicals, as well as copolymers of different substituted p-xylylene diradicals wherein the substituted groups are all the same but each diradical containing a differing number of substituent groups can all be obtained through said pyrolysis process.

Copolymerization occurs simultaneously with condensation upon cooling of the vaporous mixture of reactive diradicals to a temperature below 200° C. under polymerization conditions.

Copolymers can be made by maintaining the substrate surface at a temperature below the ceiling condensation temperature of the lowest boiling diradical desired in the copolymer, such as at room temperature or below. This is considered "copolymerizing conditions," since at least two of the diradicals will condense and copolymerize in a random copolymer at such temperature.

In the pyrolytic process of di-p-xylylene the reactive diradicals are prepared by pyrolyzing the substituted and/or unsubstituted di-para-xylylene at a temperature between about 450° C. and about 700° C., and preferably at a temperature between about 550° C. to about 600° C. At such temperatures, essentially quantitative yields of the reactive diradical are secured. Pyrolysis of the starting di-p-xylylene begins at about 450° C.–550° C. but such temperatures serve only to increase time of reaction and lessens the yield of polymer secured. At temperatures above about 700° C., cleavage of the substituent group can occur, resulting in a tri-/or polyfunctional species causing cross-linking and highly branched polymers.

Pyrolysis temperature is essentially independent of the operating pressure. For most operations, pressures within the range of 0.01 micron to 10 mm. Hg are most practical for pyrolysis. Likewise if desirable, inert vaporous diluents such as nitrogen, argon, carbon dioxide, helium and the like can be employed to vary the optimum temperature of operation or to change the total effective pressure in the system.

A laminate containing a plurality of alternating conductive and dielectric layers can be used to form a wide variety of thin film resistor and capacitor components. The desired resistor or capacitor component is electrically isolated from the remainder of the laminate by cutting, preferably by etching through a suitable mask, through the appropriate number of laminate layers. Etching through the appropriate layers is achieved by use of selective etchants. The desired component value is achieved by isolating a certain width of the laminate.

Figure 2:
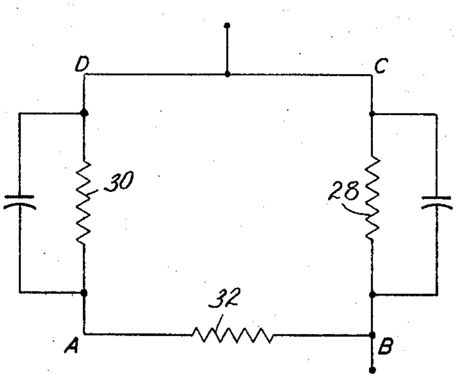
FIG. 2 is an electrical schematic diagram of the specific integrated circuit represented by the components of FIG. 1.
Figure 3:
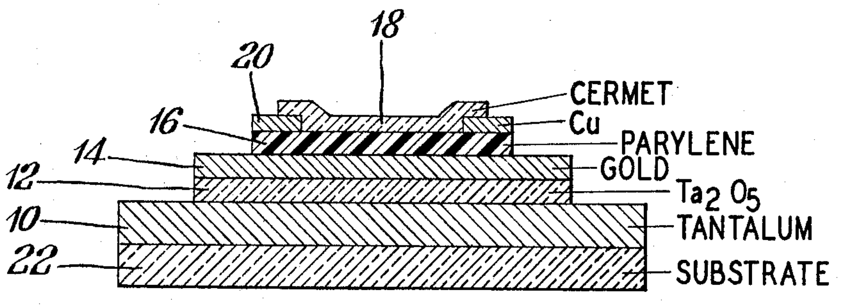
FIG. 3 is an elevational cross-section of the laminate of the present invention showing typical preferred materials of construction.

Several isolated components are shown in FIG. 1. Metal ceramic resistors 28, 30 and 32 are isolated by the indicated cuts which extended at least through the layers 16, 18 and 20. The values of the resistors were varied by varying the distance between cuts. The smaller the distance between cuts, the higher the resistance. Capacitors comprising metal layers 14 and 20 and dielectric layer 16 were isolated by cutting through the laminate down through at least layer 14. Additional capacitors involving metal layers 10 and 14 and dielectric layer 12 were isolated by continuing the cuts down through layer 10. The resulting isolated resistors and capacitors can be connected into an integrated circuit as shown by the illustrative connections in FIG. 1. These connections form a filter circuit having a schematic diagram shown in FIG. 2. The connections need not be limited to wires as shown but could be formed through use of an evaporated conductive metal pattern. The laminate shown in FIG. 1 illustrates a preferred form of the invention comprising alternate layers of tantalum 10, tantalum pentoxide 12, gold 14, silicon monoxide or Parylene 16, copper 20 and chromium-silicon moloxide cermet 18 applied to a suitable substrate 22. Exemplary values for the resistor and capacitor elements of the laminate shown in FIG. 1 are about 50,000 ohms for a one mil width of layer 18 (designated as resistor $R_2$), 1000 micromicrofarads capacitance per mil width of layers 10, 12 and 14 (designated as capacitor $C_1$) and 2 micromicrofarads capacitance per mil width of layers 14, 16 and 20 (designated as capacitor $C_2$). The circuit shown in FIGS. 1 and 2 thus consist of resistor 28 (42 K-ohms, about 1.2 mils wide), resistor 30 (42 K-ohms, about 1.2 mils wide), resistor 32 (1 K-ohms, about 50 mils wide) and two capacitors $C_2$ (300 micromicrofarads). Locations A, B, C, D of FIG. 1 are indicated in the schematic diagram of FIG. 2.

The laminates of the present invention are especially useful in the production of thin film components and integrated circuits since the components can be isolated by cutting along simple line patterns rather than requiring the complex masking techniques employed by the prior art.

What is claimed is:

1. A laminate useful for the production of a variety of thin film passive resistor and capacitor electric circuit components which comprises a plurality of alternating conductive and dielectric layers, wherein at least one conductive layer forms a low resistance film component, at least one conductive layer forms a high resistance film component, at least one dielectric layer forms the dielectric of a low unit capacitance film planar capacitor and at least one dielectric layer forms the dielectric of a high unit capacitance film planar capacitor.

2. A laminate useful for the production of a variety of thin film passive resistor and capacitor electric circuit components which comprises a first conductive metal layer which forms a low resistance film component, a first dielectric layer which forms the dielectric of a high unit capacitance film planar capacitor, said first dielectric layer bonded to said first conductive metal layer, a second conductive metal layer which forms an electrode of a film capacitor, said second conductive metal layer bonded to said first dielectric layer, a second dielectric layer which forms the dielectric of a low unit capacitance film planar capacitor, said second dielectric layer bonded to said second conductive metal layer and a conductive metal-ceramic layer which forms a high resistance film component, said conductive metal-ceramic layer bonded to said second dielectric layer.

3. A laminate structure containing a variety of thin film passive resistor and capacitor electric circuit components which comprises an insulating substrate, a first conductive metal layer which forms a low resistance film component, said first conductive metal layer bonded to said insulating substrate, a first dielectric layer which forms the dielectric of a high unit capacitance film planar capacitor, said first dielectric layer bonded to said first conductive metal layer and having a smaller surface area than said first conductive metal layer, a second conductive metal layer which forms an electrode of a film capacitor, said second conductive metal layer bonded to said first dielectric layer, a second dielectric layer which forms the dielectric of a low unit capacitance film planar capacitor, said second dielectric layer bonded to said second conductive metal layer and having a smaller surface area than said second conductive metal layer, a conductive metal-ceramic layer which forms a high resistance film component, said conductive metal-ceramic layer bonded to said second dielectric layer and having a smaller surface area than said second dielectric layer, and third and fourth conductive metal layers which form electrical contacts, said third and fourth conductive metal layers extending along either side of the second dielectric layer and in electrical contact with the conductive metal-ceramic layer and the second dielectric layer, said third and fourth conductive metal layers each bonded to both the conductive metal-ceramic layer and the second dielectric layer the resistor and capacitor components being electrically isolated from one another by grooves in the laminate originating in the outermost layer and extending into underlying layers.

4. The laminate structure of claim 3 wherein the first conductive metal layer is selected from the class consisting of tantalum, aluminum, tungsten, niobium, hafnium, titanium and zirconium, the first dielectric layer is selected from the class consisting of tantalum oxide, aluminum oxide, tungsten oxide, niobium oxide, hafnium oxide, titanium oxide and zirconium oxide the second conductive metal layer and the third and fourth conductive metal layers are selected from the class consisting of gold, silver, copper, platinum, iridium, palladium and rhodium, and the second dielectric layer is selected from the class consisting of silicon monoxide and poly-p-xylylenes.

5. A laminate structure useful for the production of thin film resistor and capacitor electric circuit components, said structure having a length greater than its width and comprising a plurality of alternating conductive and dielectric layers wherein at least one conductive layer forms a low resistance film component, at least one conductive layer forms a high resistance film component, at least one dielectric layer forms the dielectric of a low unit capacitor film planar capacitor, and at least one dielectric layer forms the dielectric of a high unit capacitance film planar capacitor.

6. A laminate structure containing thin film passive resistor and capacitor circuit components which comprises an insulating substrate having disposed thereon a plurality of alternating conductive and dielectric layers, wherein at least one conductive layer forms a low resistance film component, at least one conductive layer forms a high resistance film component, at least one dielectric layer forms the dielectric of a low unit capacitance film planar capacitor, and at least one dielectric layer forms the dielectric of a high unit capacitance film planar capacitor, the resistor and capacitor components being electrically isolated from one another by grooves in the structure originating in the outermost layer and extending into underlying layers.

7. The laminate structure of claim 6 wherein electrical contact leads are connected to said resistor and capacitor circuit components.

8. A laminate structure useful for the production of a plurality of thin film resistor and capacitor electric circuit components on a single substrate which comprises an insulating substrate, a first conductive layer of a conductive metal bonded to said substrate and having a planar configuration with a length greater than its width, said layer forming a low resistance film component, a first dielectric layer overlying the first conductive layer and having a width less than that of the first conductive layer, said first dielectric layer forming the dielectric of any high capacitance film planar capacitor components desired, a second conductive metal layer overlying the first dielectric layer and having the same width as the first dielectric layer, a second dielectric layer overlying the second conductive layer and having a width less than that of the underlying second conductive layer, said second dielectric layer forming the dielectric of any low unit capacitance film planar capacitors desired, a high resistance conductive layer overlying the second dielectric layer and having a width less than that of the second dielectric layer, said high resistance conductive layer forming any high resistance film components desired, and films of conductive metal located on each side of the high resistance conductive layer extending to the edge of the underlying second dielectric layer.

9. The laminate structure of claim 8 wherein grooves are located in said structure originating in the uppermost layer and extending into underlying layers across the full width thereof to electrically isolate sections of said structure for use as discrete resistor and capacitor circuit elements, the distance between the grooves determining a desired dimension of the so formed electrical components.

10. The grooved laminate structure of claim 9 wherein electrical contacts are made to conductive metal edge portions of the discrete electrical components located between adjacent grooves.

References Cited by the Examiner

UNITED STATES PATENTS 3,061,911 11/1962 Baker ------------- 174—68.5

ROBERT K. SCHAEFER, *Primary Examiner.*

KATHLEEN H. CLAFFY, *Examiner.*

J. J. BOSCO, *Assistant Examiner.*